United States Patent
Ikeuchi et al.

(10) Patent No.: US 11,378,086 B2
(45) Date of Patent: Jul. 5, 2022

(54) SMALL-SIZED ELECTRIC FAN

(71) Applicant: RHYTHM CO., LTD., Saitama (JP)

(72) Inventors: Hajime Ikeuchi, Saitama (JP); Hideki Fujii, Saitama (JP)

(73) Assignee: RHYTHM CO., LTD., Saitama (JP)

( * ) Notice: Subject to any disclaimer, the term of this patent is extended or adjusted under 35 U.S.C. 154(b) by 21 days.

(21) Appl. No.: 16/959,684

(22) PCT Filed: May 23, 2018

(86) PCT No.: PCT/JP2018/019881
§ 371 (c)(1),
(2) Date: Jul. 2, 2020

(87) PCT Pub. No.: WO2019/155648
PCT Pub. Date: Aug. 15, 2019

(65) Prior Publication Data
US 2020/0378390 A1    Dec. 3, 2020

(30) Foreign Application Priority Data

Feb. 6, 2018   (JP) .............................. JP2018-019166

(51) Int. Cl.
*F04D 25/06*      (2006.01)
*F04D 25/08*      (2006.01)
(Continued)

(52) U.S. Cl.
CPC ....... *F04D 25/0693* (2013.01); *F04D 25/084* (2013.01); *F04D 29/522* (2013.01); *H01R 13/72* (2013.01)

(58) Field of Classification Search
CPC .... F04D 19/002; F04D 25/06; F04D 25/0673; F04D 25/0693; F04D 25/08;
(Continued)

(56) References Cited

U.S. PATENT DOCUMENTS 6,705,891 B1 *   3/2004   Lin .................. G11B 33/02
                                                       439/501
8,215,983 B2 *   7/2012   Obata ................. H05K 5/0247
                                                       439/528

(Continued)

FOREIGN PATENT DOCUMENTS

JP       S5751189 U      3/1982
JP       3091327 U       1/2003
(Continued)

OTHER PUBLICATIONS

International Search Report for PCT Application No. PCT/JP2018/019881 issued by JPO as ISA dated Aug. 28, 2018.

*Primary Examiner* — Devon C Kramer
*Assistant Examiner* — Joseph S. Herrmann
(74) *Attorney, Agent, or Firm* — Kubotera & Associates, LLC (57) ABSTRACT

A small-sized electric fan using a USB power source has such a structure that the small-sized electric fan is provided with: a body case 1; a blade part 2; a motor M that rotationally drives the blade part; a USB cable 3 provided with a connector 4 that is detachably connected to the USB power source; and a lid case 5 that is provided to the body case 1 so as to be openable/closable and turnable, in which the body case 1 is provided with a groove part 12 that can store therein the USB cable when the USB cable 3 is wound around the groove part 12, on a case side surface part 11 along a rotation direction of the blade part 2, a connector inserting part 14 to which the connector 4 of the USB cable 3 can be inserted is provided on the case side surface part 11 or a case back surface part 13 of the body case 1, and the USB cable 3 has a cable length that allows the connector 4 to be inserted to the connector inserting part 14, when the (Continued)

USB cable 3 is wound around the groove part 12 of the case side surface part 11 at least once.

7 Claims, 11 Drawing Sheets

(51) Int. Cl.
*F04D 29/52* (2006.01)
*H01R 13/72* (2006.01)

(58) Field of Classification Search
CPC .... F04D 25/084; F04D 29/002; F04D 29/522; F04D 29/703; F04D 25/0613; H01R 13/72; H05K 7/00
See application file for complete search history.

(56) References Cited

U.S. PATENT DOCUMENTS

| | | | | |
|---|---|---|---|---|
| 2005/0155830 A1* | 7/2005 | Huang | ............... | H01R 35/025 |
| | | | | 191/12.2 R |
| 2011/0223016 A1* | 9/2011 | Ediger | ............... | F04D 25/08 |
| | | | | 415/213.1 |
| 2011/0268567 A1* | 11/2011 | Ching | ............... | F04D 25/08 |
| | | | | 415/213.1 |
| 2013/0108481 A1* | 5/2013 | Hoye | ............... | F04D 29/601 |
| | | | | 417/234 |
| 2018/0288992 A1* | 10/2018 | Gallegos | ............... | A01M 1/106 |

FOREIGN PATENT DOCUMENTS

| | | | | |
|---|---|---|---|---|
| JP | 2007323584 | A | * | 12/2007 |
| JP | 2008130203 | A | * | 6/2008 |
| JP | 3142979 | U | | 7/2008 |
| JP | 3166928 | U | | 3/2011 |
| JP | 3174468 | U | | 3/2012 |

* cited by examiner

SMALL-SIZED ELECTRIC FAN

TECHNICAL FIELD AND BACKGROUND ART

The present invention relates to an electric fan using a USB power source, and more specifically relates to a transportable small-sized electric fan that can be stored in a compact manner by winding a USB cable therearound.

Conventionally, transportable small-sized electric fans of a battery type have been known. The electric fan of a battery type is required to frequently replace the battery in use for a long period of time, which takes time and trouble and is troublesome and non-economic, and in view of such problems, for example, electric fans each using a USB power source have been proposed as indicated by Patent Literatures 1 to 3.

In the electric fans of such a type that each use the USB power source, as for a transportable electric fan, as a separate component, a cover is used to prevent dust from adhering thereon, a tool for winding up a USB cable to be used is equipped, or a tool for bundling the cable is used.

PATENT REFERENCES

PTL 1: Japanese Utility Model Registration No. 3091327
PTL 2: Japanese Utility Model Registration No. 3166928
PTL 3: Japanese Utility Model Registration No. 3174468

In the electric fans of such a type that each use the USB power source, the electric fans that uses separate components, such as a cover by being provided, a tool for winding up a USB cable by being equipped, and a tool for bundling the cable by being used, have such a problem that the separate components may be lost.

Moreover, the tool for winding up the cable and the like have a complicated structure, which results in high cost to cause an inconvenience.

Therefore, an object of the present invention is to obtain a small-sized electric fan using a USB power source that can prevent the problems and the inconvenience described above, can be stored in a more compact manner than the conventional one, and can be produced at low cost.

SUMMARY OF THE INVENTION

The invention of the present application is, by assigning reference numerals used in the embodiments, a small-sized electric fan using a USB power source, the small-sized electric fan characterized by including:

a body case 1; a blade part 2 that is stored in the body case; a motor M that rotationally drives the blade part; a USB cable 3 provided with a connector 4 that is detachably connected to the USB power source, and a lid case 5 that is provided to the body case 1 so as to be openable/closable and turnable, in which the body case 1 is provided with a groove part 12 that can store therein the USB cable 3 when the USB cable is wound around the groove part 12, on a case side surface part 11 along a rotation direction of the blade part 2, a connector inserting part 14 to which the connector 4 of the USB cable 3 can be inserted is provided on the case side surface part 11 or a case back surface part 13 of the body case 1, and the USB cable 3 has a cable length that allows the connector 4 to be inserted to the connector inserting part 14 when the USB cable is wound around the groove part 12 of the case side surface part 11 at least once.

The invention described in claim 2 of the present application is the small-sized electric fan according to claim 1 characterized in that a position of the connector inserting part 14 and the cable length of the USB cable 3 are set so as to allow the connector 4 to be inserted to the connector inserting part 14, in both cases where a winding direction of the USB cable 3 is a clockwise direction and a counterclockwise direction.

The invention of the present application is the small-sized electric fan characterized in that a lower end portion of the lid case 5 is provided to a lower end portion at a front surface side of the body case 1 via a hinge member 6 so as to be turnable.

The invention of the present application is the small-sized electric fan characterized in that the body case 1 is provided with a contact part 15 that locks, when the lid case 5 is turned, the lid case at a position where an angle between the body case 1 and the lid case 5 does not exceed 90 degrees, behind the body case 1.

The invention of the present application is the small-sized electric fan characterized in that a slip avoiding structure 52 that serves as a non-slip portion with respect to a mounting target object on which the body case 1 is mounted is formed on a front surface portion 51 of the lid case 5.

The invention of the present application is the small-sized electric fan characterized in that the slip avoiding structure 52 is formed by attaching a member 52b having flexibility to a front surface side of the lid case 5.

The invention of the present application is the small-sized electric fan characterized in that the slip avoiding structure 52 is formed by attaching a magnet member 52c to the front surface side of the lid case 5.

With the invention of the present application, the lid case 5 is provided to the body case 1 so as to be openable/closable and turnable, so that it is possible to cover the body case 1 with the lid case 5 so as to prevent dust and the like from entering the blade part 2 when the electric fan is out of use, without providing a lid as a separate component.

Moreover, the body case 1 is provided with the groove part 12 that can store therein the USB cable, on the case side surface part 11 along the rotation direction of the blade part 2, and when the USB cable 3 is wound around the groove part 12, the USB cable is accordingly stored in the groove part 12, so that it is possible to attain a compact storage form in the electric fan, together with the lid case 5.

In addition, the connector inserting part 14 to which the connector 4 of the USB cable 3 can be inserted is provided on the case side surface part 11 or the case back surface part 13 of the body case 1, and the USB cable 3 has a cable length that allows the connector 4 to be inserted to the connector inserting part 14 when the USB cable is wound around the groove part 12 of the case side surface part 11 at least once, so that it is possible to store the USB cable 3 without being loosened.

With the invention of the present application, in both cases where the winding direction of the USB cable 3 is the clockwise direction and the counterclockwise direction, the position of the connector inserting part 14 and the cable length of the USB cable 3 are provided such that the connector 4 can be inserted to the connector inserting part 14, so that a user can select either of the clockwise direction and the counterclockwise direction as the winding direction of the USB cable 3, and can improve the flexibility of winding-up of the USB cable 3.

With the invention of the present application, the lower end portion of the lid case 5 is provided to the lower end portion on a front surface side of the body case 1 so as to be turnable via the hinge member 6. Accordingly, the lid case 5 is turned to close the front surface side 1 and can prevent dust and the like from entering the blade part 2, and can also serve as a bottom plate part of the body case 1 at the lower end portion of the body case 1.

Moreover, with the invention of the present application, the contact part 15 that locks, when the lid case 5 is turned, the lid case at the position where the angle between the lid case 5 and the body case 1 does not exceed 90 degrees behind the body case 1 is provided, so that when the lid case 5 is placed to a mounting target object of the electric fan, for example, a table, the body case 1 is inclined upward while keeping the angle that does not exceed 90 degrees relative to the vertical direction, and the electric fan when being in use thus blows air in an upwardly inclined direction, which is generally convenient to use.

With the invention of the present application, the slip avoiding structure 52 that serves as a non-slip portion with respect to the mounting target object on which the a body case 1 is mounted is formed on the front surface portion 51 of the lid case 5, so that the front surface portion 51 of the body case 1 can avoid a slip phenomenon with respect to the mounting target object.

The slip avoiding structure 52 may use an appropriate slip avoiding member such as a case where the slip avoiding structure 52 is formed by attaching members 52b having flexibility, for example, nonrigid plastic members or rubber members having flexibility, to the front surface side of the lid case 5, as is in claim 6 of the present application.

Moreover, in a case where a mounting target object is a magnetic body, the slip avoiding structure 52 may have the structure of the present application, that is, magnet members 52c may be attached to the front surface side of the lid case 5.

DETAILED DESCRIPTION OF PREFERRED EMBODIMENTS

Hereinafter, descriptions will be given of an embodiment of the present invention by use of the accompanying drawings (FIGS. 1 to 7). A small-sized electric fan in this embodiment is an electric fan using a USB power source, and includes a body case 1, a blade part 2 that is stored in the body case, a motor M that rotationally drives the blade part, and a lid case 5 that is provided to the body case 1 so as to be openable/closable and turnable. Note that, although the illustration is omitted, a USB cable with a connector that is detachably connected to the USB power source is separately provided. Note that, in the drawings, a reference numeral 6 indicates a hinge member, and a reference numeral 7 indicates a switch.

The body case 1 is provided with a groove part 12 that can store therein the USB cable when the USB cable is wound around the groove part 12, on a case side surface part 11 along a rotation direction of the blade part 2, and is further provided with a connector inserting part to which the connector of the USB cable can be inserted, on a case back surface part of the body case 1 or on the case side surface part 11.

Note that, as will be described in details later, the USB cable has a cable length that allows the connector to be inserted to the connector inserting part, when the USB cable is wound around the groove part 12 of the case side surface part 11 at least once.

Figure 11:
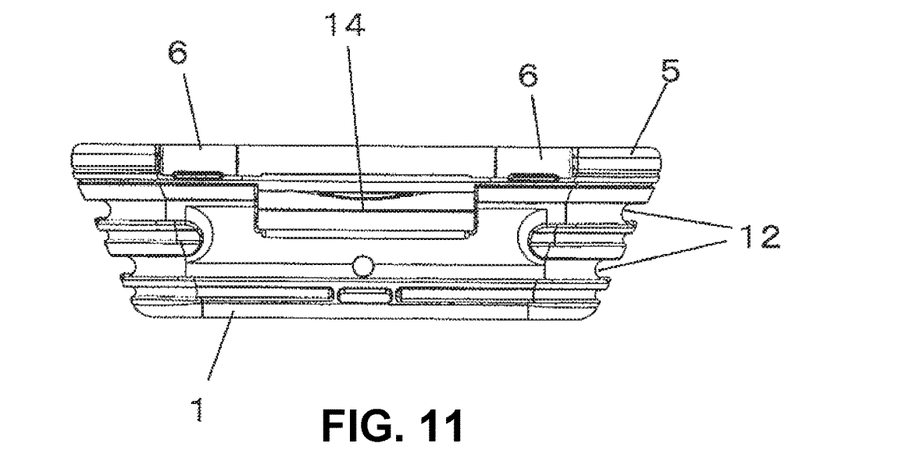
FIG. 11 is a bottom view illustrating the small-sized electric fan according to another embodiment (second embodiment) of the present invention.
Figure 12:
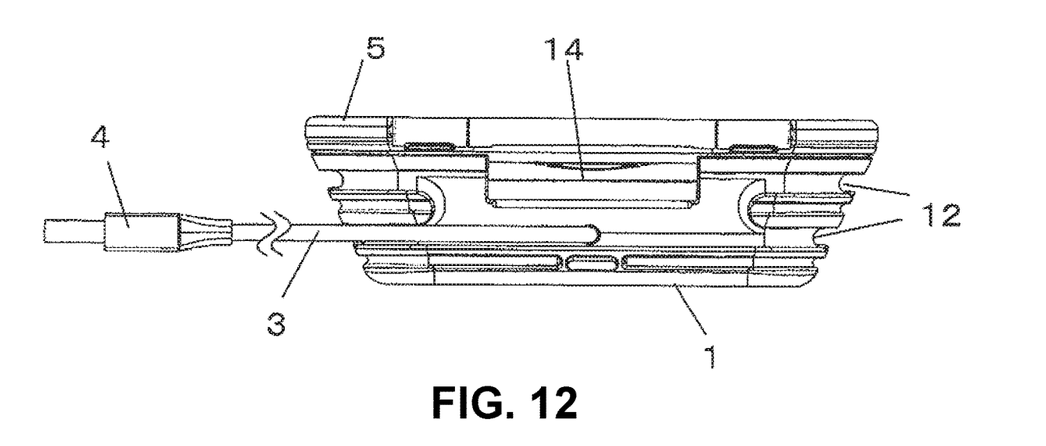
FIG. 12 is a bottom view illustrating a USB cable with the small-sized electric fan in FIG. 11 according to another embodiment (second embodiment) of the present invention.

In addition, descriptions will be given using the drawings (FIGS. 8 to 16) of a second embodiment of the present invention. As illustrated in FIG. 11, in this embodiment, a connector inserting part 14 to which a connector 4 of a USB cable 3 can be inserted is provided on the case side surface part 11 of the body case 1. Meanwhile, the connector inserting part 14 may be provided on an appropriate location such as a case back surface part 13.

In this embodiment, the USB cable 3 has a cable length that allows the connector 4 to be inserted to the connector inserting part 14, when the USB cable is wound around the groove part 12 of case side surface part 11 at least once.

Figure 13:
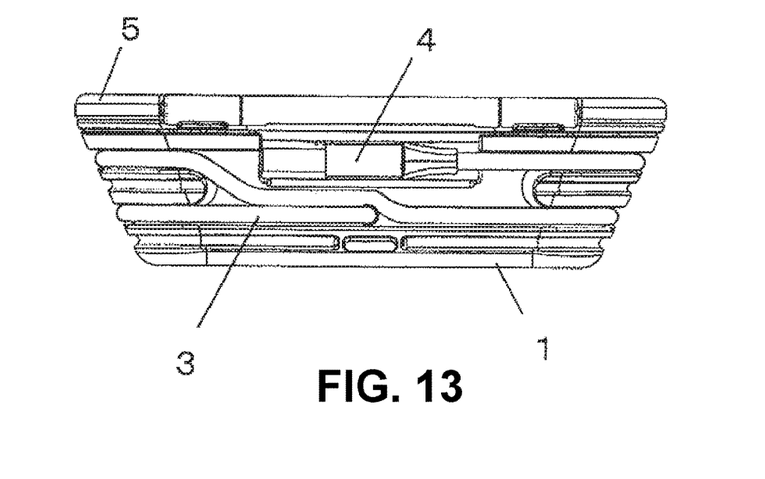
FIG. 13 is a bottom view illustrating a state where the USB cable in FIG. 12 is wound around the small-sized electric fan in a clockwise direction according to another embodiment (second embodiment) of the present invention.
Figure 14:
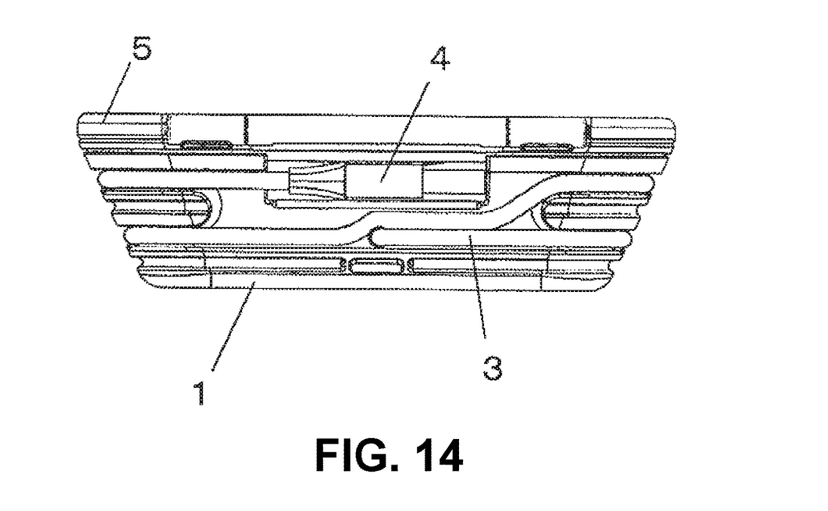
FIG. 14 is a bottom view illustrating a state where the USB cable in FIG. 12 is wound around the small-sized electric fan in a counterclockwise direction according to another embodiment (second embodiment) of the present invention.

Note that, a position of the connector inserting part 14 and the cable length of the USB cable 3 are not limited to those described above, but the connector inserting part 14 may be provided such that the connector 4 can be inserted to the connector inserting part 14 in both cases where a winding direction of the USB cable 3 is a clockwise direction and a counterclockwise direction.

With the embodiment described above, the lid case 5 is provided to the body case 1 so as to be openable/closable and turnable, so that it is possible to cover the body case 1 with the lid case 5 so as to prevent dust and the like from entering the blade part 2 when the electric fan is out of use, without providing a lid as a separate component.

Moreover, the body case 1 is provided with the groove part 12 that can store therein the USB cable, on the case side surface part 11 along the rotation direction of the blade part 2, and when the USB cable 3 is wound around the groove part 12, the USB cable is accordingly stored in the groove part 12, so that it is possible to attain a compact storage form in the electric fan, together with the lid case 5.

In addition, the connector inserting part 14 to which the connector 4 of the USB cable 3 can be inserted is provided on the case side surface part 11 or the case back surface part 13 of the body case 1, and the USB cable 3 has a cable length that allows the connector 4 to be inserted to the connector inserting part 14 when the USB cable is wound around the groove part 12 of the case side surface part 11 at least once, so that it is possible to store the USB cable 3 without being loosened.

Moreover, in both cases where the winding direction of the USB cable 3 is the clockwise direction and the counterclockwise direction, when the position of the connector inserting part 14 and the cable length of the USB cable 3 are provided such that the connector 4 can be inserted to the connector inserting part 14, a user can select either of the clockwise direction and the counterclockwise direction as the winding direction of the USB cable 3, and can improve the flexibility of winding-up of the USB cable 3.

In addition, in this embodiment, a lower end portion of the lid case 5 is provided to a lower end portion on a front surface side of the body case 1 so as to be turnable via a hinge member 6. Accordingly, the lid case 5 is turned to close the front surface side of the body case 1 and can prevent dust and the like from entering the blade part 2, and can serve as a bottom plate part of the body case 1 at the lower end portion of the body case 1.

Moreover, in the body case 1, provided is a contact part 15 that locks, when the lid case 5 is turned, the lid case at a position where an angle between the body case 1 and the lid case 5 does not exceed 90 degrees behind the body case 1.

The contact part 15 that locks, when the lid case 5 is turned, the lid case at the position where the angle between the lid case 5 and the body case 1 does not exceed 90 degrees behind the body case 1 is provided, so that when the lid case 5 is placed to a mounting target object of the electric fan, for example, a table, the body case 1 is inclined upward while keeping the angle that does not exceed 90 degrees relative to the vertical direction, and the electric fan when being in use thus blows air in an upwardly inclined direction, which is generally convenient to use.

A slip avoiding structure 52 that serves as a non-slip portion with respect to the mounting target object on which the body case 1 is mounted is formed on a front surface portion 51 of the lid case 5. Note that, a rib 52a having a concave-convex shape is formed on the front surface portion 51 of the lid case 5. The rib 52a is provided for preventing sink marks and improving the strength, as will be described later, and also functions as a slip avoiding structure.

Figure 1:
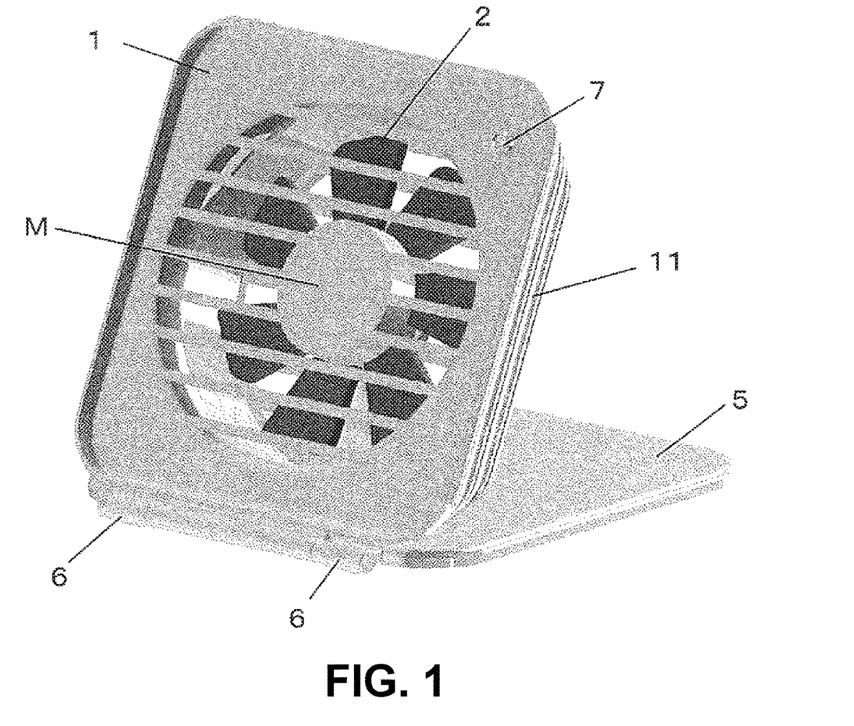
FIG. 1 is a perspective view illustrating a small-sized electric fan in use according to an embodiment of the present invention.
Figure 2:
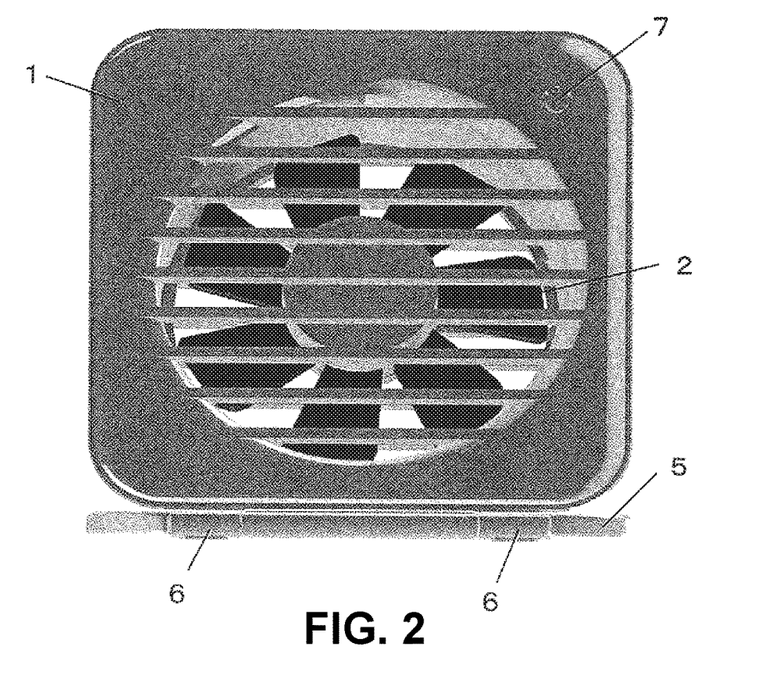
FIG. 2 is a front view illustrating the small-sized electric fan in use according to the embodiment of the present invention.
Figure 3:
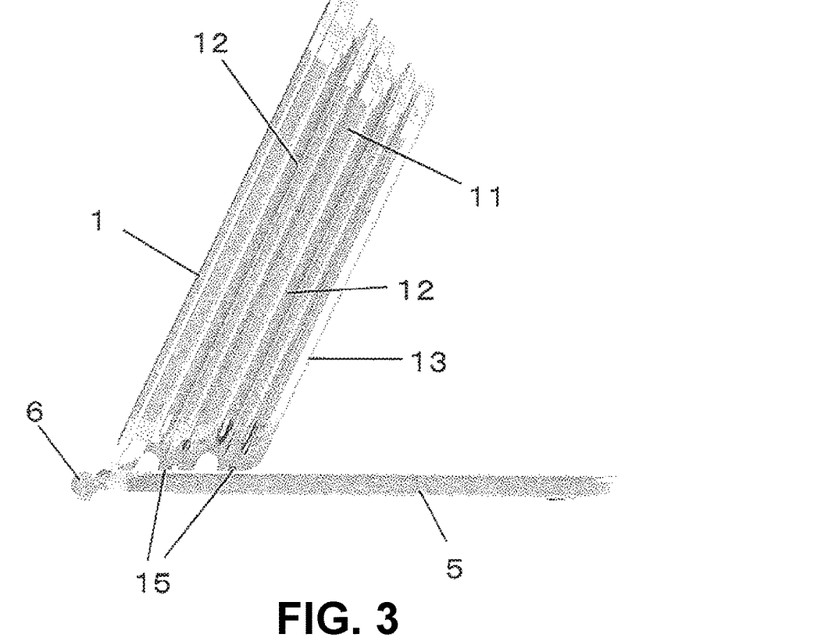
FIG. 3 is a right side view illustrating the small-sized electric fan in use according to the embodiment of the present invention.
Figure 4:
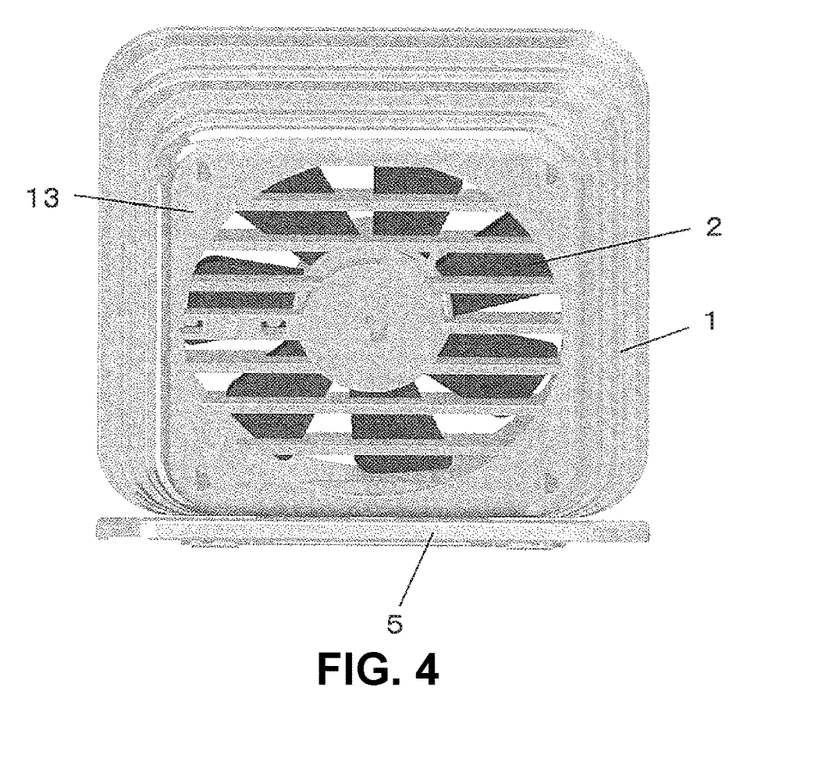
FIG. 4 is a back view illustrating the small-sized electric fan in use according to the embodiment of the present invention.
Figure 5:
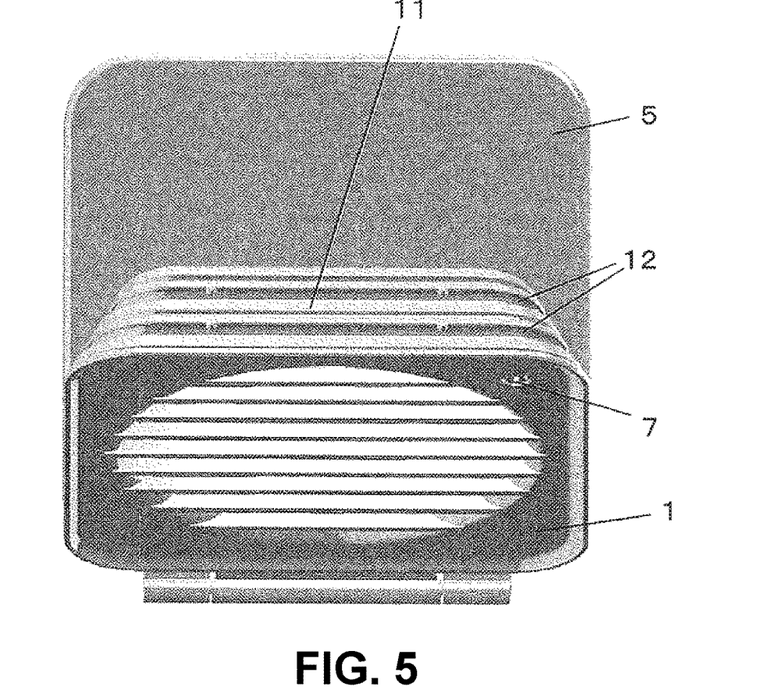
FIG. 5 is a plan view illustrating the small-sized electric fan in use according to the embodiment of the present invention.
Figure 6:
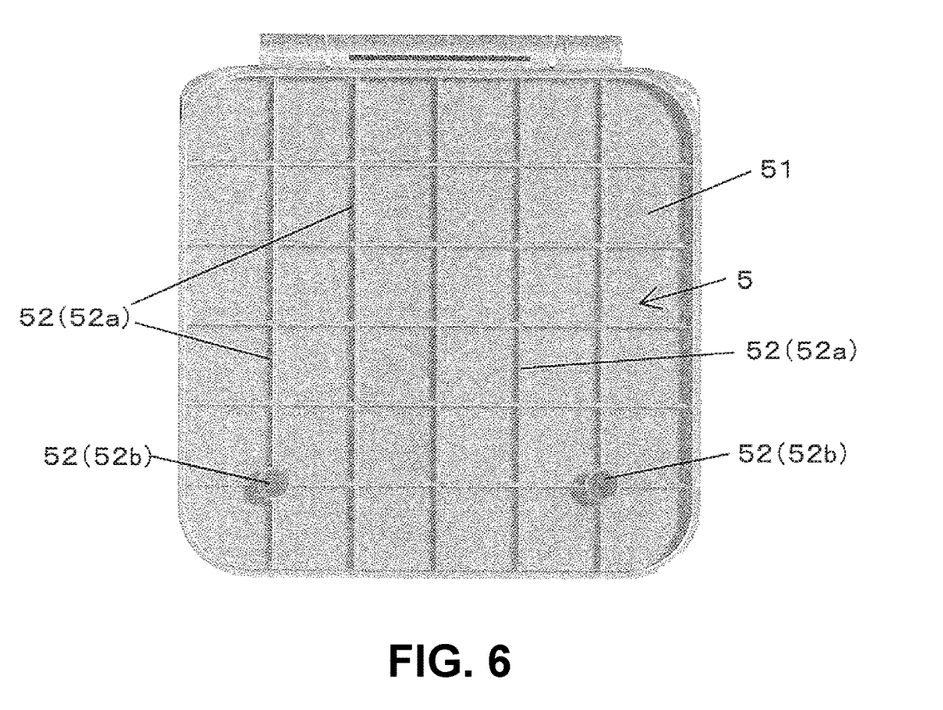
FIG. 6 is a bottom view illustrating the small-sized electric fan in use according to the embodiment of the present invention.
Figure 7:
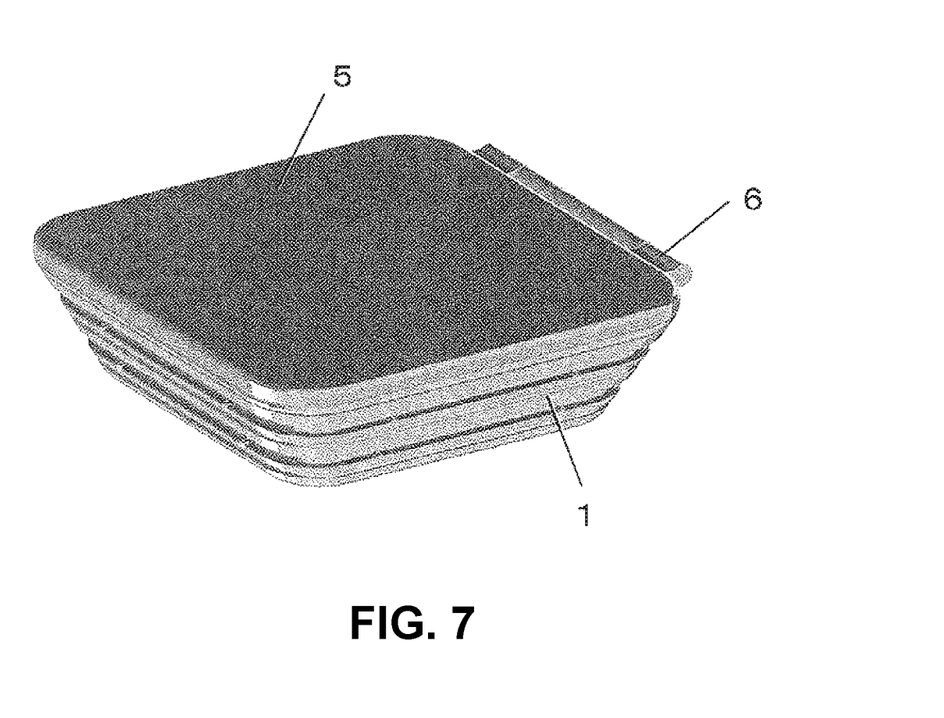
FIG. 7 is a perspective view illustrating the small-sized electric fan out of use according to the embodiment of the present invention.
Figure 8:
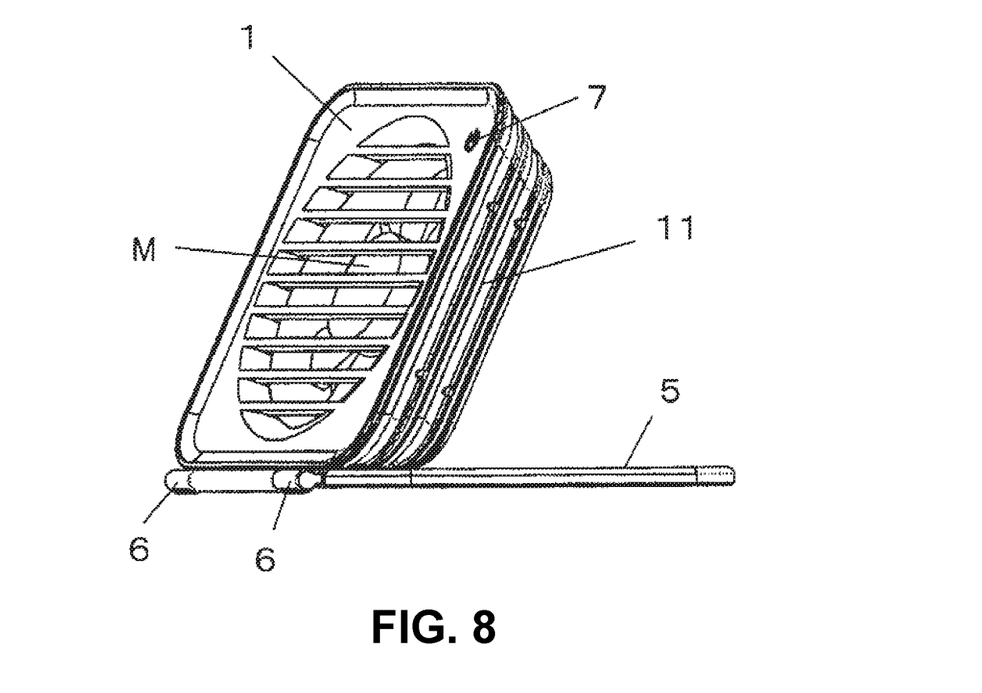
FIG. 8 is a perspective view illustrating a small-sized electric fan in use according to another embodiment (second embodiment) of the present invention.
Figure 9:
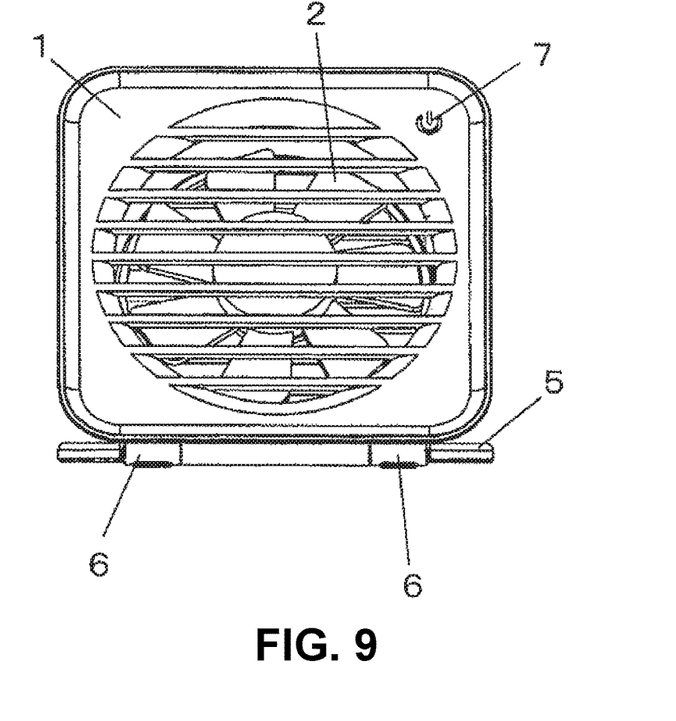
FIG. 9 is a front view illustrating the small-sized electric fan in use according to another embodiment (second embodiment) of the present invention.
Figure 10:
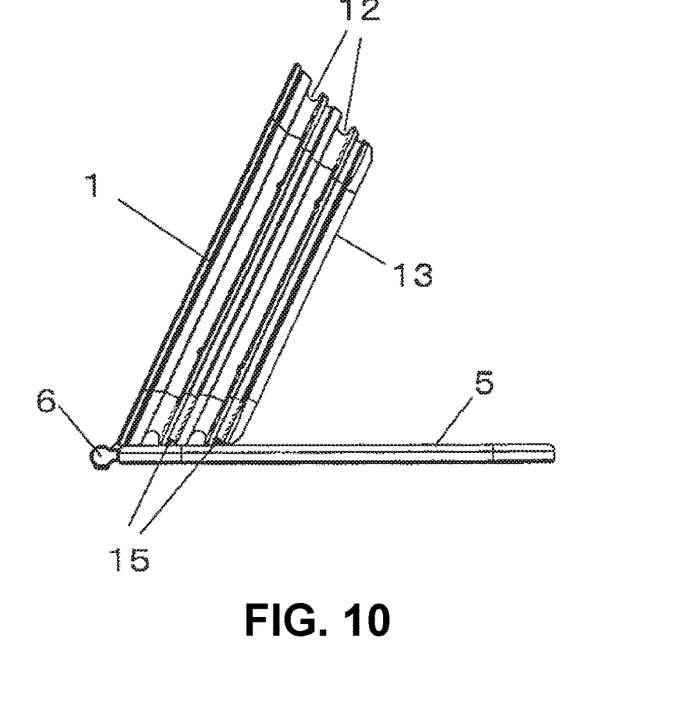
FIG. 10 is a right side view illustrating the small-sized electric fan in use according to another embodiment (second embodiment) of the present invention.

The slip avoiding structure 52 may use an appropriate slip avoiding member, as illustrated in FIG. 6, such as a case where the slip avoiding structure 52 is formed by providing the rib 52a having a concave-convex shape on the front surface portion 51 of the lid case 5, and by attaching members 52b having flexibility, for example, nonrigid plastic members or rubber members having flexibility, to a front surface side of the lid case 5.

Figure 15:
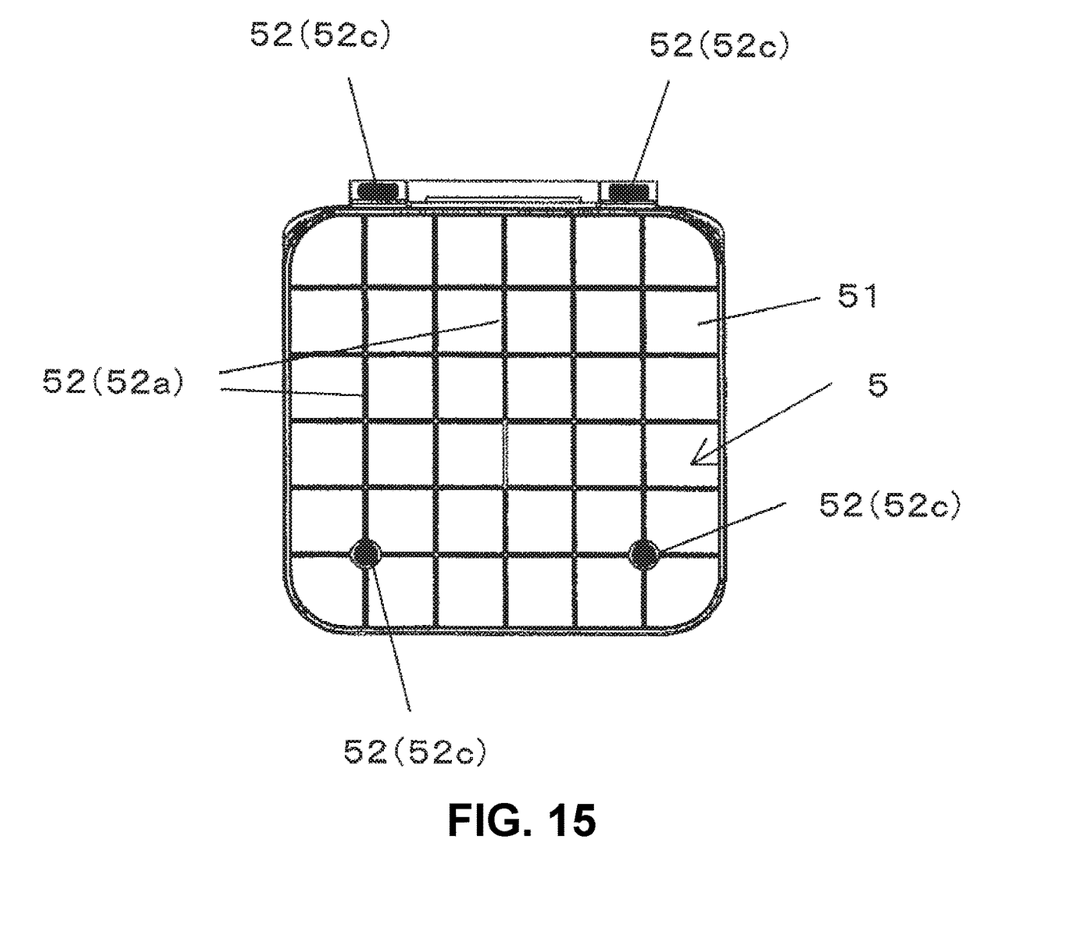
FIG. 15 is a front view illustrating a lid case according to another embodiment (second embodiment) of the present invention.
Figure 16:
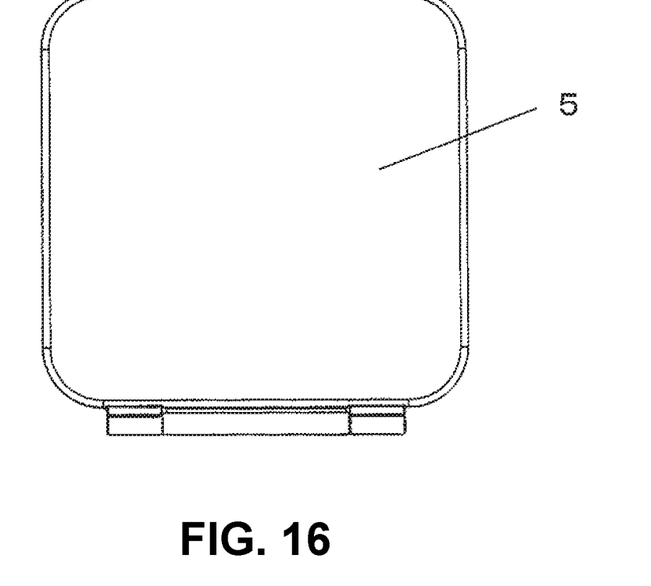
FIG. 16 is a back view illustrating the lid case according to another embodiment (second embodiment) of the present invention.

Note that, in a case where a mounting target object is a magnetic body, the slip avoiding structure 52 may be formed by attaching magnet members 52c to appropriate points at the front surface side of the rib 52a and the lid case 5, as illustrated in FIG. 15, for example.

Figure 17:
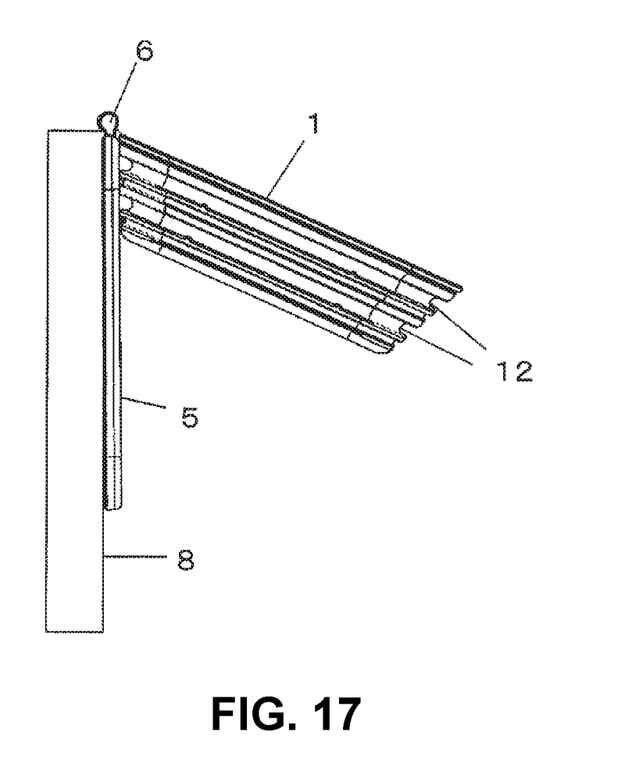
FIG. 17 is a view illustrating a state where the small-sized electric fan is mounted on a mounting target object that is a magnetic body according to another embodiment (second embodiment) of the present invention.

In a case where the magnet members 52c are attached to the lid case 5, as illustrated in FIG. 17, it is possible to fix the lid case 5, that is, the body case 1, to a wall surface 8 formed of the magnetic body via the magnet members 52c. As is this example, in a case where the magnet members 52c are attached, it is possible to mount the small-sized electric fan at an appropriate position of an office machine made of a metal magnetic body in an office, for example, and thus enhance the general versatility for use. Moreover, a double-sided adhesive tape and the like can also be used as a member of the slip avoiding structure.

As described in the foregoing, when the lid case 5 is turned and is positioned below the body case 1, the front surface portion 51 of the lid case faces a top surface of a mounting target object, for example, a desk or a table, of the body case 1. Further, the slip avoiding structure 52 that serves as a non-slip portion with respect to the mounting target object on which the body case 1 is mounted is formed on the front surface portion 51, so that the front surface portion 51 of the body case 1 can avoid a slip phenomenon with respect to the mounting target object.

Note that, as the slip avoiding structure 52, in addition to those described above, an appropriate unit including a large-sized magnet, a double-sided adhesive tape, or the like may be provided to the front surface portion 51 of the lid case 5.

Figure 18:
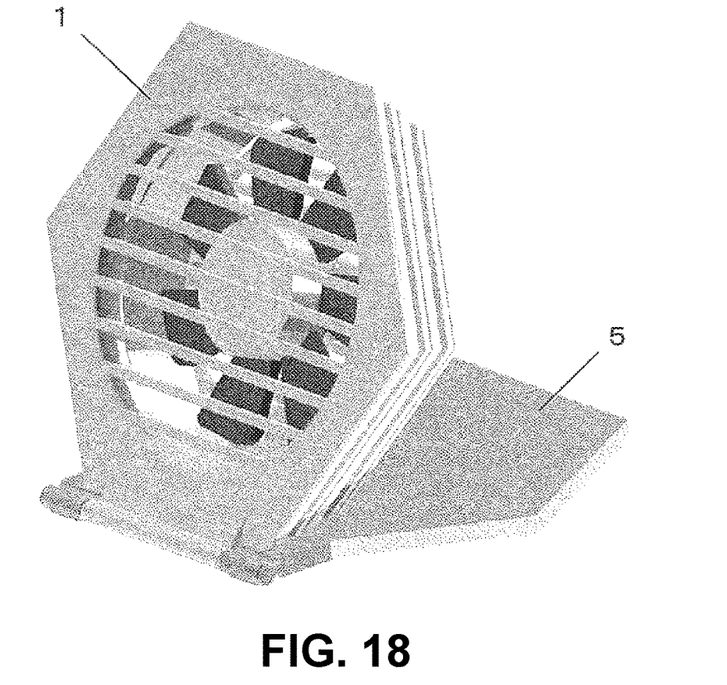
FIG. 18 is a perspective view illustrating a small-sized electric fan in use according to another embodiment (third embodiment) of the present invention.
Figure 19:
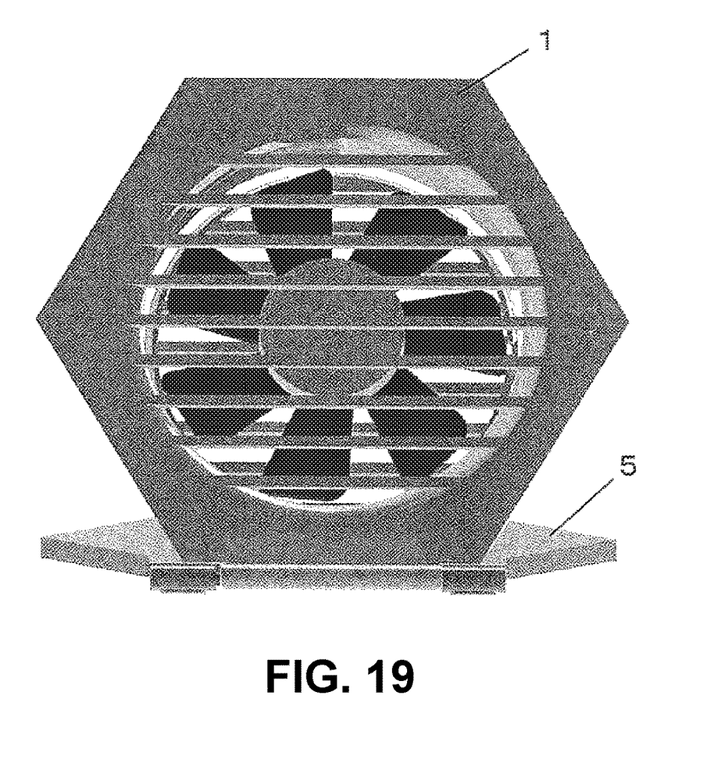
FIG. 19 is a perspective view illustrating the small-sized electric fan in use according to another embodiment (third embodiment) of the present invention.
Figure 20:
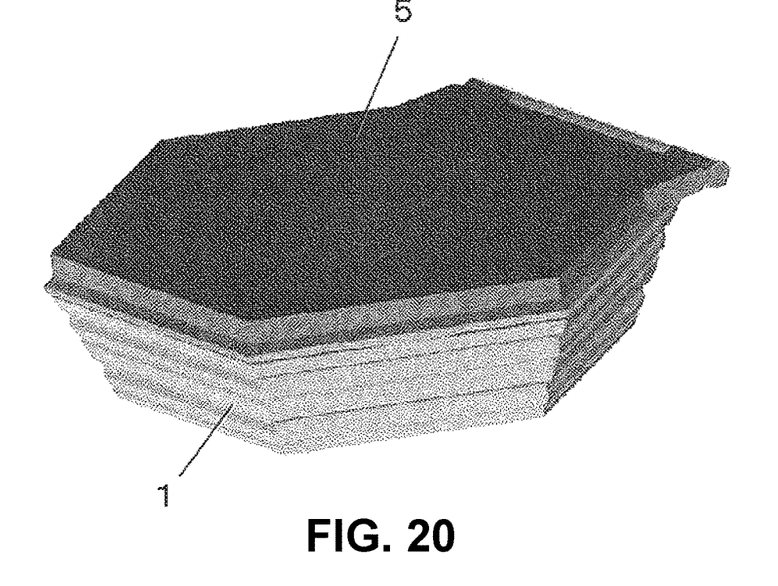
FIG. 20 is a perspective view illustrating the small-sized electric fan out of use according to another embodiment (third embodiment) of the present invention.
Figure 21:
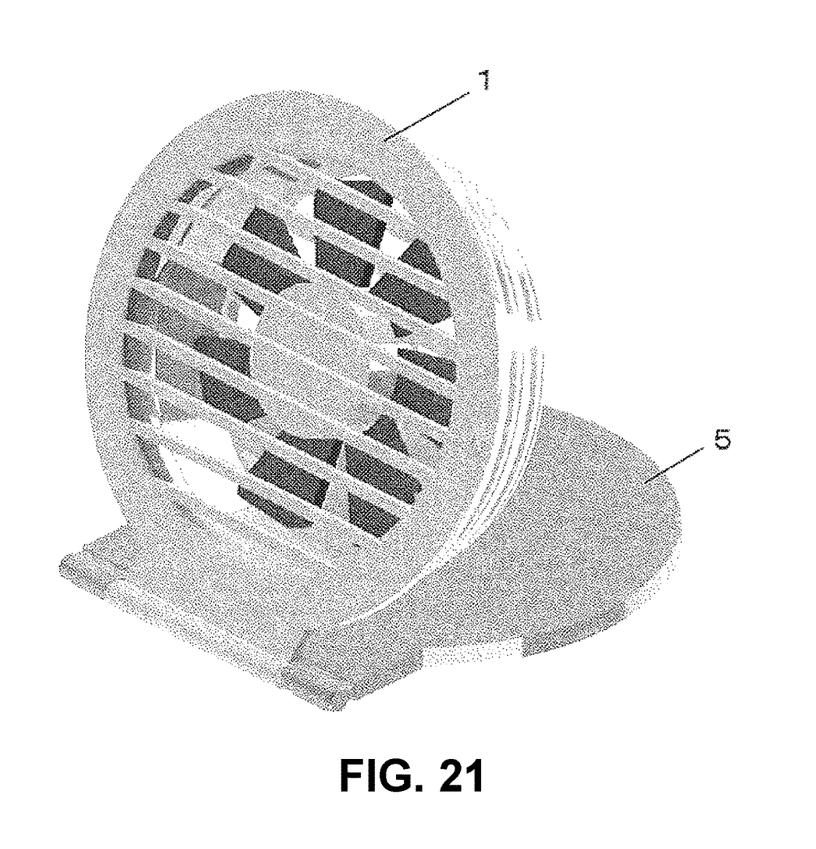
FIG. 21 is a perspective view illustrating a small-sized electric fan in use according to another embodiment (fourth embodiment) of the present invention.
Figure 22:
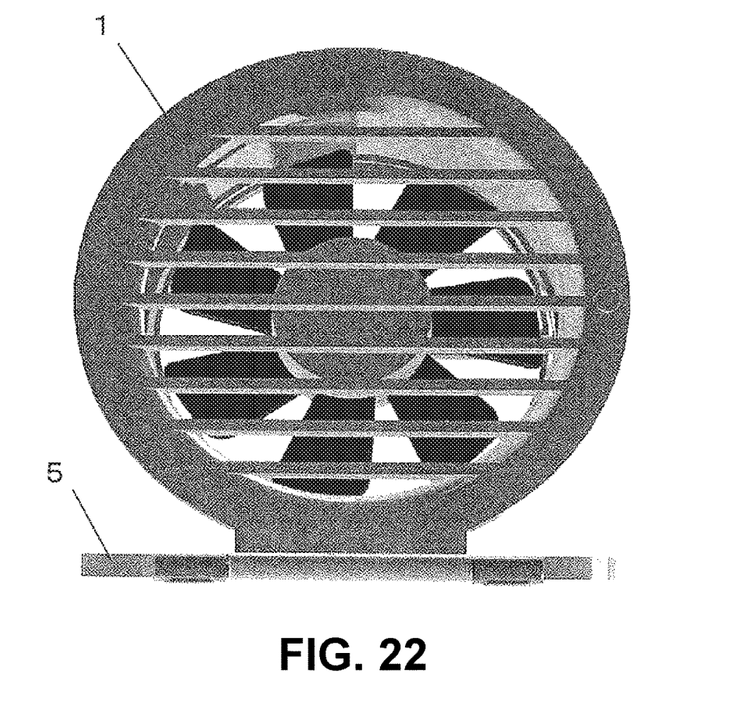
FIG. 22 is a perspective view illustrating the small-sized electric fan in use according to another embodiment (fourth embodiment) of the present invention.
Figure 23:
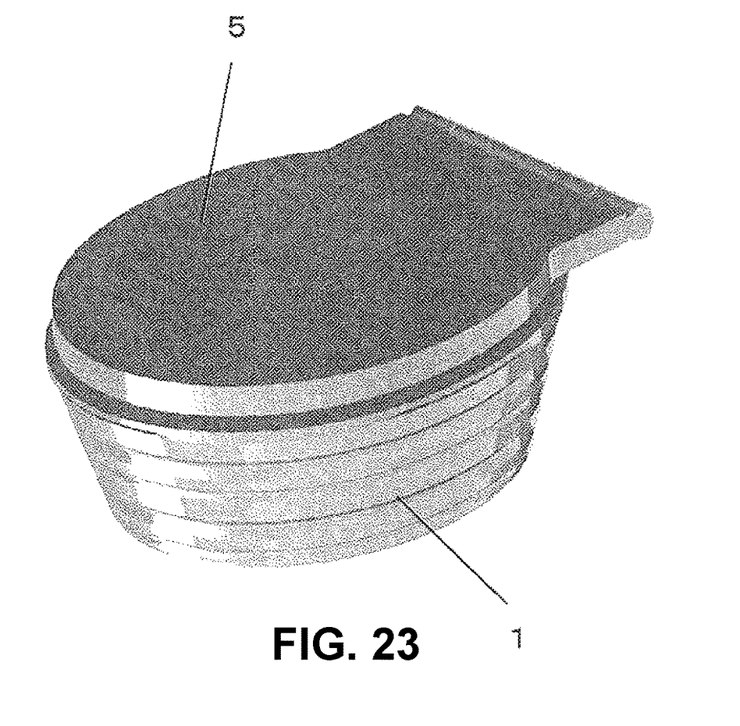
FIG. 23 is a perspective view illustrating the small-sized electric fan out of use according to another embodiment (fourth embodiment) of the present invention.

Moreover, the small-sized electric fan according to the present invention is applicable to, in addition to the small-sized electric fan with the body case 1 having a rectangular shape in front view, such as those in the first and second the embodiments, the small-sized electric fan with the body case 1 having an appropriate shape, such as a hexagonal shape in a third embodiment illustrated in FIGS. 18 to 20 and a circular shape in a fourth embodiment illustrated in FIGS. 21 to 23.

As has been explained in the foregoing, the small-sized electric fan in the embodiments is can be stored in a more compact manner than the conventional one, and is rationally configured in structure as a small-sized electric fan using a USB power source that can be produced at low cost. Note that, the configuration of each element in the embodiments can be changed in design as appropriate within the technical range described in the claims, and is naturally not limited to those explained and illustrated.

The present invention can be preferably used for the general storage structure of the small-sized electric fan that is provided with a USB cable and uses a USB power source.

REFERENCE NUMERALS

1: body case, 2: blade part, 3: USB cable, 4: connector, 5: lid case, 6: hinge member, 7: switch, 8: wall surface, 11: case side surface part, 12: groove part, 13: case back surface part, 14: connector inserting part, 15: contact part, 51: front surface portion of lid case, 52: slip avoiding structure, 52 (52*a*): rib, 52 (52*b*): member having flexibility, 52 (52*c*): magnet member, M: motor.

What is claimed is:

1. An electric fan using a USB power source, the electric fan comprising:
    a body case;
    a blade part that is stored in the body case;
    a motor that rotationally drives the blade part;
    a USB cable provided with a connector that is detachably connected to the USB power source; and
    a lid case that is connected to the body case so as to be openable/closable and turnable,
    wherein the body case is provided with a groove part that can store therein the USB cable when the USB cable is wound in the groove part, on a case side surface part along a rotation direction of the blade part,
    a connector inserting part to which the connector of the USB cable can be inserted is provided on the case side surface part or a case back surface part of the body case,
    the USB cable has a cable length that allows the connector to be inserted to the connector inserting part when the USB cable is wound around the groove part of the case side surface part at least once,
    the groove part includes a first sub groove portion and a second sub groove portion,
    the groove part further includes a connecting portion that connects the first sub groove portion and the second sub groove portion,
    the first sub groove portion has a circumferential length greater than that of the second sub groove portion, and
    the first sub groove portion is connected to the connector inserting part.

2. The electric fan according to claim 1, wherein a position of the connector inserting part and the cable length of the USB cable are set so as to allow the connector to be inserted to the connector inserting part, in both cases where a winding direction of the USB cable is a clockwise direction and where a winding direction of the USB cable is a counterclockwise direction.

3. The electric fan according to claim 1, wherein a lower end portion of the lid case is connected to a lower end portion at a front surface side of the body case via a hinge member so as to be turnable.

4. The electric fan according to claim 1, wherein the body case is provided with a contact part that locks, when the lid case is turned, the lid case at a position where an angle between the body case and the lid case does not exceed 90 degrees, behind the body case.

5. The electric fan according to claim 1, wherein a slip avoiding structure that serves as a non-slip portion with respect to a mounting target object on which the body case is mounted is formed on a front surface portion of the lid case.

6. The electric fan according to claim 5, wherein the slip avoiding structure is formed by attaching a member having flexibility to a front surface side of the lid case.

7. The electric fan according to claim 5, wherein the slip avoiding structure is formed by attaching a magnet member to a front surface side of the lid case.

* * * * *